United States Patent [19]
Hayhurst et al.

[11] Patent Number: 5,093,095
[45] Date of Patent: Mar. 3, 1992

[54] CRYSTALLIZATION IN A FORCE FIELD

[75] Inventors: David T. Hayhurst, Willoughy; Peter J. Melling, Worthington; Wha J. Kim, Cleveland, all of Ohio

[73] Assignee: Battelle Memorial Institute, Columbus, Ohio

[21] Appl. No.: 233,287

[22] Filed: Aug. 17, 1988

[51] Int. Cl.⁵ .............................................. C01B 33/34
[52] U.S. Cl. .............................. 423/329; 23/295 G; 156/600; 156/603; 156/621; 156/623R
[58] Field of Search ..................... 23/295 R, 295 G; 423/305 A, 305, 306, 326, 328, 329, 330; 156/622, 603, 621, 623 R, 623 Q, 624, 600; 422/245; 502/214

[56] References Cited

U.S. PATENT DOCUMENTS

| | | | |
|---|---|---|---|
| 2,484,829 | 10/1949 | Holden | 156/622 |
| 2,663,921 | 12/1953 | Cito | 156/622 |
| 3,357,798 | 12/1967 | yamashita et al. | 23/285 |
| 3,702,886 | 11/1972 | Argauer et al. | 423/328 |
| 3,777,006 | 12/1973 | Rundell et al. | 423/118 |
| 4,073,867 | 2/1978 | Roebke et al. | 423/328 |
| 4,375,458 | 3/1983 | Dwyer et al. | 423/329 |
| 4,385,195 | 5/1983 | Butter et al. | 585/481 |
| 4,440,871 | 4/1984 | Lok et al. | 502/214 |
| 4,557,917 | 12/1985 | Valyocsik et al. | 423/328 |
| 4,610,855 | 9/1986 | Valyocsik et al. | 423/328 |
| 4,619,818 | 12/1986 | Derouane et al. | 423/306 |
| 4,623,527 | 11/1986 | Derouane et al. | 423/306 |
| 4,632,811 | 12/1986 | Derouane et al. | 423/306 |
| 4,647,442 | 3/1987 | Derouane et al. | 423/306 |
| 4,650,656 | 3/1987 | Dwyer et al. | 423/329 |
| 4,654,138 | 3/1987 | Derouane et al. | 208/114 |
| 4,673,559 | 6/1987 | Derouane et al. | 423/306 |
| 4,695,642 | 9/1987 | Derouane et al. | 556/14 |
| 4,713,227 | 12/1987 | Derouane et al. | 423/306 |
| 4,778,780 | 10/1988 | Valyocsik et al. | 502/214 |
| 4,832,927 | 5/1989 | Higgins et al. | 423/306 |
| 4,880,611 | 11/1989 | von Ballmoos et al. | 423/306 |
| 4,891,197 | 1/1990 | Derouane et al. | 423/279 |
| 4,898,722 | 2/1990 | Derouane et al. | 423/328 |

FOREIGN PATENT DOCUMENTS 1292017 10/1972 United Kingdom.

OTHER PUBLICATIONS

Schlichta et al., Growth of Crystals by Centrifugation, Journal of Crystal Growth 3, 4 (1968) 808-813.

Wilcox et al., Movement of Crystal Inclusions in a Centrifugal Field, Journal of Applied Physics, vol. 42, No. 5 (1971) 1823-1827.

Scheel et al., Flux Growth of Large Crystals by Accelerated Crusible-Rotation Technique, Journal of Crystal Growth, 8 (1971), 304-306.

Scheel, Accelerated Crucible Rotation: a Novel Stirring Technique in High-Temperature Solution Growth, Journal of Crystal Growth 13/14 (1972) 560-565.

Tolksdorf et al., The Effect of Local Cooling and Accelerated Crucible Rotation on the Quality of Garnet Crystals, Journal of Crystal Growth 13/14 (1972) 566-570.

Chu et al., Growth of Boron Monophosphide Crystals With the Accelerated Container Rotation Technique, Journal of Crystal Growth 33 (1976) 53-57.

Tolksdorf et al., Verbesserte Tiegelformen Zur Herstellung von Yttrium-Esien-Granot-Einkristalen aus Schmelzflüssiger Lösung, Journal of Crystal Growth 35, (1976) 285-296.

Turner et al., Control of de Motors for ACRT Growth, Journal of Crystal Growth 35 (1976) 234-235.

Durcok et al., Modification of the Top-Seeded Growth From High Temperature Solutions, Journal of Crystal Growth 82 (1987) 501-508.

White et al., The Growth of Large Area, Uniformly Doped TGS Crystals, Journal of Crystal Growth 32 (1976) 149-156.

Lillicrap et al., Production of Large Areas, Doped and Undoped TGS Crystals by the Rotating Disc Method, Journal of Crystal Growth 41 (1977) 205-215.

Novotn et al., Growth of TES From Slightly Supersaturated Solutions, Journal of Crystal Growth 11 (1971) 329-335.

Brice et al., The Czochralski Growth of Barium Strontium Niobate Crystals, Journal of Crystal Growth 10 (1971) 133-138.

Afanasiadi et al., Equipment for Controlled Crystallization of Materials in a Centrifugal-Force Field, Industrial Laboratory, vol. 40, No. 12, pp. 1791–1792, Dec. 1974, (publ. Jun. 1975), (trans. of: Zavod. Lab. (USSR).
Müller et al., Tenfold Growth Rates in the Travelling Heater Method of GaSb Crystals by Forced Convection on a Centrifuge, Journal of Crystal Growtn 63 (1983) 58–66.
Rodot, Cristaux de Tellurure de Plomb Élaborés en Centrifuge Use, Journal of Crystal Growth 79 (1986) 77–83.
Müller, A Comparative Study of Crystal Growth Phenomena Under Reduced and Enhanced Gravity, Journal of Crystal Growth 99 (1990) 1242–1257.
Cochran, The Flow Due to a Rotating Disc, Proc. Cambridge Phil. Soc. 97 (1989) 18

European Patent Office, International Search Report 89/03482.

*Primary Examiner*—R. Bruce Breneman
*Attorney, Agent, or Firm*—Watkins, Dunbar & Pollick

[57] ABSTRACT

The production of enhanced crystals is achieved through the use of forces greater than 1 G. This enhanced force technique has wide application to various crystal growth methodologies and produces crystals that are larger, of more uniform size, of better quality, or in higher yields than can be obtained for the same technique using similar times in a 1 G force.

28 Claims, 2 Drawing Sheets

CRYSTALLIZATION IN A FORCE FIELD

STATEMENT OF GOVERNMENT RIGHTS

This invention was made with Government support under NASA Grant No. NAGW-811 awarded by the NATIONAL AERONAUTICS AND SPACE ADMINISTRATION; the government has certain rights in the invention.

FIELD OF THE INVENTION

The present invention relates to improved methods of crystallization. More specifically, it relates to the crystallization methods using forces greater than the earth's gravitational force.

BACKGROUND OF THE INVENTION

The effect of gravity on crystal growth has recently come under study with the result of recent micro or zero gravity experiments. Zetterlund and Fredriksson (*Materials Letters* 1982, 1 (3, 4), 127–129) studied the growth of indium antimonide from its melt under microgravity conditions and formulated mathematical expressions for the effects of gravity on freely growing crystals. Rodot et al. (*J. Cryst. Growth* 1986, 79 (1–3, [Pt. 1]), 77–83 studied the effects of gravitational forces up to G on crystals grown from their own melt (Bridgeman method) and concluded that the quality of the crystals was similar to those grown in space. In neither case was an attempt made to study the effect of gravity on crystals grown by techniques other than from a crystal melt.

U.S. Pat. No. 4,385,042 to Whitehurst et al. discloses an invention that takes advantage of normal gravitational forces in separating larger size crystals from a slurry of crystal particles as a result of tendency of the larger crystals to settle to bottom of a reactor where they are removed. Here normal gravity is used to separate different size crystals; high gravity is not used to directly promote or enhance crystal size in the growth process.

The need for large sized crystals is significant in the chemical arts, one such art being the zeolite art. U.S. Pat. No. 3,777,006 to Rundell and McDaniel discloses the preparation of type A, X, and Y zeolites using a seeding technique. Zeolites with a size in excess of 200 microns were obtained. U.S. Pat. No. 4,073,865 to Flanigen et al. discloses the preparation of crystals of a silica polymorph with a size of approximately 200 microns using increased temperature, decreased pH, and the addition of fluoride ions.

Flanigen (*Nature* 1978, 271 (9 February) 516) reveals the preparation the silicalite with a 1 crystal size of about 70 microns. Fegán et al. (*J. Chem. Soc. Faraday Trans.* 82 (1, Part 3)) discloses the preparation of silicalite crystals that are 100 microns long using low-pH and high temperatures.

U.S. Pat. No. 4,650,656 to Dwyer et al. discloses the preparation of aluminosilicate zeolites of the ZSM-5 type in excess of 1 micron using high temperatures, agitation, and the addition of an alkylammonium component. U.S. Pat. No. 4,375,458 to zeolite with a high $SiO_2$ to $Al_2O_3$ ratio, with a crystal size greater than 20 microns by using two different kinds of alkylammonium ions or an alkylammonium ion in combination with a metallic cation of ionic radius greater than 1.4 angstroms. Lermer et al. (*Zeolites* 1985, 5(3) 131–134) reveal the preparation of ZSM-5 zeolites of a length of up to 280 microns using high temperatures and a ten day crystallization period.

The need for techniques to produce enhanced crystals has been long felt in the chemical arts. In X-ray crystallography, a crystal of sufficient size is a prerequisite to obtaining a detailed structured analysis. In zeolite adsorbent systems, it is desirable to have the crystals of a relatively large size range, i.e., above about 200 microns. Use of crystals in this size range, solve several of the problems inherent in adsorbent systems, e.g., prevention of the packing and channeling of the zeolite bed that lessen the desired adsorptive properties of the zeolitic material. In zeolite membrane systems, it is desireable to have only one crystal face exposed to the inflowing gas since in zeolites such as ZSM-5, the pore channels are three dimensional having different pore size openings and different diffusional properties for each crystallographic orientation. Thus it is desireable to eliminate twinned crystals from such membrane systems. In catalyst systems, it is desireable to be able to control crystal size distribution and crystal length in order to reduce the external surface area of the crystals and force the reaction to occur in the internal structure of the crystals. In most crystallization operations, it is desirable to reduce significantly nucleation and crystallization times. Finally, it goes without saying that increased yields are almost universally sought.

SUMMARY OF THE INVENTION

The long felt needs for a process for more readily growing enhanced crystals described above is met by the present invention which discloses the production of enhanced crystals using forces greater than 1 G. By enhanced crystals is meant crystals of larger size, better quality (e.g., reduced twinning), greater yield, or more uniform size than obtained using similar techniques and reaction times in a 1 G gravitational force, that is, in the normal earth gravitational field. The enhanced force technique of this invention can be applied to various crystal growing techniques including, but not limited to, crystal growth from solvent media, crystal growth from solids, and crystal growth from gels, where a gel may be, but is not limited to, aqueous solutions, reactive solids, colloidal sols and glasses. Crystal growth may be proceeded by or concurrent with a chemical reaction that gives rise to the material that is crystallized. The crystallization process can be initiated by seed crystals, a crystal growth template, or spontaneous nucleation.

This new force crystal growth process has application to, but is not limited to, the preparation of various zeolites and similar type materials. Thus, as examples, the following zeolites and zeolite-like materials may be prepared using this technique: Zeolites A, X, Y, ZSM-5, ZSM-11, ZSM-12, ZSM-35, alumino-phosphates, metal incorporated alumino-phosphates, pillared inter-layered compounds, and zeolites in which Si is replaced in whole or in part by Al, Ga, Ge, Be, B, Fe, Cr, P, or Mg or combinations thereof.

Illustrative of the present invention, a method is disclosed for preparing a crystalline zeolite having a $SiO_2$ to $Al_2O_3$ molar ratio of from about 5 to about 100,000 and having a crystal size of up to 320 microns. Crystallization takes place in force fields of from greater than 1 G to about 50 G using a reaction mixture of colloidal silica, sodium aluminate, sodium hydroxide solution, and tetrapropylammonium bromide (TPABr) with a typical reaction mixture having the composition:

$$vNa_2O—wTPABr—xAl_2O_3—ySiO_2—zH_2O,$$

where
"y" is about 0.01 to about 20.0,
"w" is about 0 to about 20.0,
"x" is 0 or 1.0,
"y" is about 2.0 to about 100,000
"z" is about 10 to about 100,000, and
TPABr is tetrapropylammonium bromide.
The reaction is carried out at about 20° to 400° C. for 1 hour to about 90 days.

The composition of a more specific reaction mixture is:

$$vNa_2O—xTPABr—100SiO_2—zH_2O.$$

where
"v" is about 0.1 to about 10.0,
"w" is about 0.1 to about 20.0,
"z" is about 100 to about 5,000, and
TPABr is tetrapropylammonium bromide.
The reaction and crystallization are carried out at a temperature from about 100° C. to about 200° C.

For a reaction mixture of 2.55Na$_2$O-5.0TPABr-100SiO$_2$-2800H$_2$O, the reaction and crystallization are carried out preferably at about 175° to 185° C. For high yields of small uniform crystals, a gravitational force of about 50 G and a reaction time of about 12 hours to about 60 hours is preferred. For large crystals, a force of about 50 G and a reaction time of about 84 hours to about 144 hours is preferred. For a reaction mixture of 2.78Na$_2$O-Al$_2$O$_3$-2.0SiO$_2$-504H$_2$O, the reaction and crystallization temperature is about 90° C. with a reaction time greater than about 4 days in a force greater than about 10 G.

Figure 1:
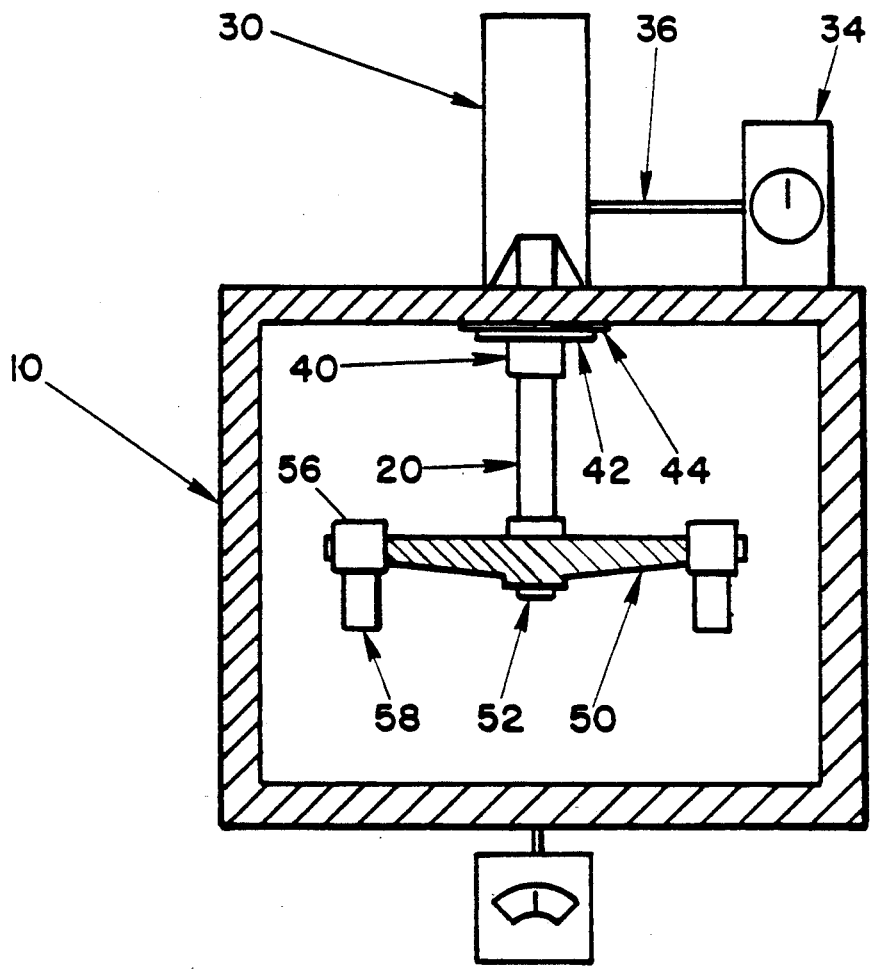
FIG. 1 is a schematic partial cross-sectional elevational view of a centrifuge oven.
Figure 2:
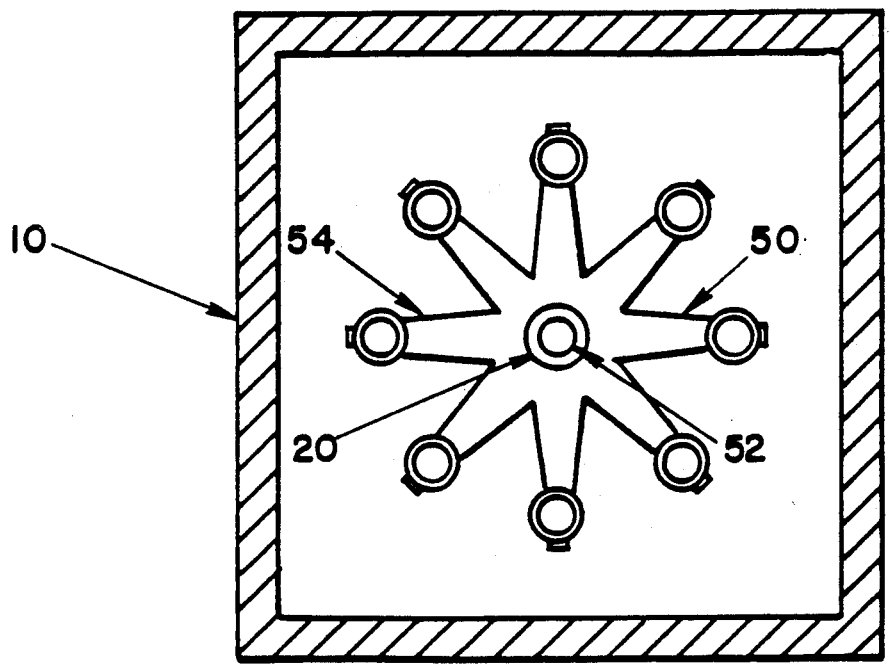
FIG. 2 is a schematic partial cross sectional plan view of the centrifuge oven.

DETAILED DESCRIPTION OF THE INVENTION AND BEST MODE FOR CARRYING OUT THE PREFERRED EMBODIMENT

The present invention relates to a new method for producing enhanced crystals of larger size, higher quality, greater yield, and more uniform size using a force greater than 1 G. The method has wide applicability in the crystallization art and may be used for crystal growth from solvent media, amorphous solids, and gels where a gel can be an aqueous solution, a reactive solid, a colloidal sol or a glass. Crystal growth may be proceeded by or concurrent with a chemical reaction. Crystal growth can be initiated by use of seed crystals, a crystal growth template, or by spontaneous nucleation. Crystal growth techniques known in the art are applicable to the crystal growth methodology of this invention, i.e., crystal growth in forces of greater than 1 G.

One area of application is the growth of zeolite-type crystals. Zeolitic crystals are ordered, porous crystalline materials having a definite crystal structure within which there are a number of still smaller channels. These cavities and channels are precisely uniform in size within a specific zeolitic material. And since the dimensions of the pores are such as to accept certain size molecules while rejecting those of larger dimensions, zeolitic materials are known as "molecular sieves" and are used in a variety of ways to take advantage of the adsorbent properties of these compositions. Large size crystals, that is, crystals greater in size than 200 microns, are particularly useful in adsorbent systems. When such large size crystals are used, the zeolitic bed does not pack and channel as quickly as when fine size materials are used and, as a result, the adsorptive properties of the zeolitic material are maintained. Examples of zeolite-type crystals are: Zeolites A, X, Y, ZSM-5, ZSM-11, ZSM-12, ZSM-35, aluminophosphates, metal incorporated alumino-phosphates, pillared interlayered compounds such as pillared clays and zirconium phosphates, and zeolites in which Si is replaced in whole or in part by Al, Ga, Ge, Be, B, Fe, Cr, P, or Mg or combinations thereof.

One general method for the preparation and crystallization of zeolites may be represented generally in the following fashion:

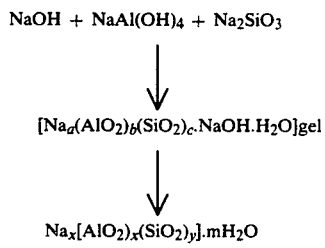

Zeolites may be prepared from silica sources such as sodium silicate, colloidal silica, silica hydrosol, silica gel, and silicic acid. The silicon may be replaced by one or more elements such as aluminum, gallium, germanium, beryllium, boron, iron, chromium, phosphorus, or magnesium. The preparation of molecular sieves is well-known in the art and is described more fully in the *Kirk-Othmer Encyclopedia of Chemical Technoloyy*, 3rd Edition, Volume 15, page 638, *Hydrothermal Chemistry of Zeolites*, R. M. Barrer, Academic Press, 1982; and references cited therein, U.S. Pat. Nos. 3,777,006 to Rundell, 4,375,458 to Dwyer, 4,650,656 to Dwyer, and herein by reference.

As an example, Zeolite ZSM-5 may be prepared from a silica source, an alumina source, a base and an organic template. The silica source may be sodium silicate, silica hydrosol, silica gel, or silicic acid. A colloidal silica such as Ludox-AS40 (DuPont; Wilmington, Del.) is preferably used as the silica source. The alumina source may be an aluminum compound such as sodium aluminate, alumina trihydrate or aluminum chloride with sodium aluminate being preferred.

A relatively high pH is maintained by the use of an alkali metal hydroxide or other strong base such as, but not limited to, tetraalkylammonium hydroxide. Preferably a 50 wt % aqueous sodium hydroxide solution (Mallinckrodt, Inc., Paris, Ky.) is used.

The organic template employed in preparing zeolitic crystals is usually selected from alkylammonium compounds and more particularly from quaternary compounds including tetraalkyl halogenated ammonium compounds such as tetramethyl ammonium or tetrapropyl ammonium bromide. However, any suitable organic compound known to those skilled in the art may be used. Furthermore, instead of the organic compound itself, precursors thereof may also be used including $C_1$–$C_{10}$ alkylammonium compound precursors. Thus in the case of tetra-n-propyl ammonium bromide, tri-n-propyl amine and n-propyl bromide may be used. Preferably, tetrapropyl ammonium bromide (Aldrich Chemical, Milwaukee, Wis.; reagent grade) is used.

The composition of an illustrative reaction mixture is:

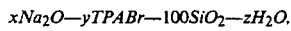

$xNa_2O\text{—}yTPABr\text{—}100SiO_2\text{—}zH_2O.$ where
"x" is about 0.1 to about 10.0,
"y" is about 0.1 to about 20.0,
"z" is about 100 to about 5,000, and
TPABr is tetrapropylammonium bromide.

The reaction and crystallization are carried out at a temperature from about 100° C. to about 200° C. in a force of greater than 1 G.

A force is maintained by means of a centrifuge placed in a forced convection oven and driven by a motor located on the outside of the oven. As shown in FIG. 1, this centrifuge oven consists of a forced convection oven 10 (Blue M Electric Company, Blue Island, Ill.) that has been modified by having a hole cut through the top to accommodate a drive shaft 20 that is connected to a motor 30 (Mixing Equipment Co., Inc., Rochester, N.Y.). The motor is secured to the top of the oven by brackets or other securing means (not shown). The rotational speed of the motor 30 is controlled by a speed controller 34 (Reliance Electric Company, Cleveland, Ohio) connected to the motor 30 by wires 36. The drive shaft 20 is rotatably secured to the oven 10 by means of a graphite bearing 40 (International Graphite Corp., Cleveland, Ohio) that is contained in a brass bearing receptacle 42. The bearing receptacle is rigidly attached to a mounting plate 44 that is securely attached to the inside of the oven top by suitable means such as machine screws or nuts and bolts (not shown). The end of the drive shaft opposite the end connected to the motor 30 is rigidly attached to a centrifuge arm plate 50 by suitable means such as a bolt 52. Each of the centrifuge arms 54 of the centrifuge arm plate 50 are equipped with reaction vessel holder 58 that is rotatably held to the centrifuge arms by a swivel 56.

For the specific reaction mixture of 2.55Na$_2$O.5.0-TPABr.100SiO$_2$.2800H$_2$O, the preferred temperature range is from about 175° to about 185° C. Forces of from greater than 1 G are used. Preferably, a force of about 50 G and a reaction time of about 12 to about 60 hours is used to obtain small uniform, nontwinned crystals in high yield. A force of about 50 G and a reaction time of about 84 to about 144 hours is preferred in order to obtain maximum sized crystals. For a reaction mixture of 2.78Na$_2$O-Al$_2$O$_3$-2.0SiO$_2$-504H$_2$O, the reaction and crystallization temperature is about 90° C. with a reaction time greater than about 4 days and a force greater than about 10 G.

The following examples are disclosed to further teach the practice of the invention and are not intended to limit the invention as it is delineated in the claims. For a fixed force crystal size and crystallization time will vary with the nature of the reaction mixture employed.

EXAMPLE 1

Preparation of Silicalite (low-alumina ZSM-5)

Ludox AS-40 (25.88 wt. %; an ammonia stabilized 40 wt. % SiO$_2$ made by DuPont, Wilmington, Del.), was weighed into a plastic beaker. To this, 71.12 wt. % water, 0.702 wt. % sodium hydroxide solution (50 wt % in water, Mallinckrodt, Inc. Paris, Ky.) and 2.298 wt % tetrapropylammonium bromide (TPABr) (Aldrich Chemical Co., Inc., Milwaukee, Wis.) were added to give a reaction mixture of 100SiO$_2$-2800H$_2$O-2.55Na$_2$O-5.0TPABr. The mixture was agitated until a uniform gel was obtained. The gel was rapidly transferred to Teflon-lined Morey-type reaction vessels. The vessels were sealed, weighed, and placed into an eight position centrifuge contained within a preheated forced convection oven. Placement of the weighed vessels was such as to achieve the best possible balance of the centrifuge.

The centrifuge was rotated at a predetermined rotational speed (RPM) and this speed was maintained throughout the experiment. At predetermined intervals, the rotation of the centrifuge was stopped and a vessel was removed from the oven. The vessel was replaced with a vessel of similar weight to preserve the balance of the centrifuge.

The product vessel was quenched using cold tap water. The product mother liquor was tested for pH. The solid products were placed in a Buchner funnel, washed a minimum of three times with 100 ml of distilled water and dried overnight at 110° C. Samples were tested for crystallinity using powder x-ray diffractometry and for size using optical and scanning electron microscopy.

Figure 3:
FIG. 3 is a photomicrograph at 50 X of the crystals obtained in a 1 G gravitational force after 120 hours according to the method of Example 1.
Figure 4:
FIG. 4 is a photomicrograph at 50 X of crystals obtained in a 30 G gravitational force after 120 hours according to the method of Example 1.

Tables 1 and 2 illustrate the effect of the force field on crystal size. FIGS. 3 and 4 are photomicrographs at 50X magnification showing the size difference attributable to the force. It is clearly evident from Tables 1 and 2 and FIGS. 3 and 4 that the size of the crystals increases significantly with the strength of the force. Moreover, for equal sized crystals, the time of crystallization is considerably decreased with increasing strength of the force.

TABLE 1

| Average ZSM-5 (silicalite) Crystal Size (microns) as a Function of Time in Force | | | |
|---|---|---|---|
| TIME | FORCE | | |
| days | 1 G | 30 G | 50 G |
| 1 | 93 | 88 | 107 |
| 2 | 60 | 116 | 135 |
| 3 | 93 | 152 | 121 |
| 4 | 46 | 175 | 115 |
| 5 | 50 | 163 | 193 |
| 6 | 53 | 192 | 198 |
| 7 | 84 | 159 | 176 |

TABLE 2

| Average ZSM-5 (silicalite) Crystal Size (microns) of largest 10% of Crystals as a Function of Time in Force | | | |
|---|---|---|---|
| TIME | FORCE | | |
| days | 1 G | 30 G | 50 G |
| 1 | 132 | 135 | 140 |
| 2 | 66 | 150 | 190 |
| 3 | 98 | 192 | 150 |
| 4 | 53 | 254 | 221 |
| 5 | 52 | 187 | 297 |
| 6 | 54 | 295 | 238 |

TABLE 2-continued

Average ZSM-5 (silicalite) Crystal Size (microns) of largest 10% of Crystals as a Function of Time in Force

| TIME | FORCE | | |
|---|---|---|---|
| days | 1 G | 30 G | 50 G |
| 7 | 103 | 166 | 208 |

TABLE 3 pH of ZSM-5 (silicalite) as a Function of Time in Force

| TIME | FORCE | | |
|---|---|---|---|
| hours | 1 G | 30 G | 50 G |
| 0 | 11.80 | 11.83 | 11.93 |
| 24 | 9.95 | 11.23 | 11.33 |
| 48 | 10.43 | 10.68 | 10.05 |
| 72 | 10.45 | ND | 10.58 |
| 96 | 10.45 | 10.64 | 10.59 |
| 120 | 10.42 | 9.75 | 10.60 |
| 144 | 9.95 | 10.30 | 9.55 |
| 168 | 9.96 | 10.48 | 10.38 |

ND — Not Determined

EXAMPLE 2

The reaction was carried out as in Example 1. The reaction time was held constant at 7 days while varying the period of time in the force. The results are presented in Table 4.

TABLE 4

ZSM-5 (silicalite) Crystal Size (microns) as a Function of Time in Force

| TIME Days in Force | FORCE | | |
|---|---|---|---|
| | 10 G | 30 G | 50 G |
| 1 | 45 | * | 235 ± 55 |
| 2 | 50 ± 20 | 150 | ⁰ |
| 3 | 130 ± 10 | 120 ± 10 | 185 ± 5 |
| 4 | 80 ± 10 | 195 ± 5 | ⁰ |
| 5 | 40 ± 10 | 145 ± 5 | 165 ± 25 |
| 6 | 60 ± 20 | 315 ± 15 | ⁰ |
| 7 | 130 ± 30 | 165 ± 5 | 165 ± 15 |

A control sample held at 1 G for 7 days yielded 70 ± 10 micron crystals.
*No Sample Taken

EXAMPLE 3

Silicalite ZSM-5 Yield Determination

The reaction was carried out as in Example 1. The product yield, as given in TABLE 5, was determined by completely emptying the contents of a reaction vessel into a pyrex beaker. These solids were treated with 500 ml of a 0.1 N sodium hydroxide solution. The slurry was agitated for thirty minutes while boiling at approximately 100° C. to insure complete dissolution of amorphous solids. The remaining purified silicalite crystals were dried at 110° C. and reweighed. The ratio of the weights of the silicate crystals to the calculated amount of $SiO_2$ contained in the original reaction mixture times one hundred gives the percent yield. As is apparent from TABLE 3, yields increase with the intensity of the force.

TABLE 5

| TIME | Yield % of ZSM-5 (silicalite) | | |
|---|---|---|---|
| | FORCE | | |
| days | 1 G | 30 G | 50 G |
| 1 | 1.3 | 4.3 | 9.9 |
| 2 | 2.3 | 8.9 | 44.3 |
| 3 | 3.2 | 9.3 | 28.0 |
| 4 | 4.3 | 14.8 | 40.5 |
| 5 | 2.8 | 46.7 | 38.9 |
| 6 | 1.7 | 43.5 | 48.5 |
| 7 | 1.9 | 41.3 | 55.5 |

Yield % = (g ZSM-5 (silicalite) crystals/g $SiO_2$ in reaction mixture) × 100

EXAMPLE 4

Preparation of Zeolite A

A thin layer of kaoline (Matheson, Coleman and Bell; Norwood Ohio) is calcined at 600° C. for 13 hrs. to form meta-kaoline, Three grams of meta-kaoline, 6.0 g of 50 wt % NaOH, and 121.8 g of distilled water were mixed for 10 minutes. The mixture of $2.78Na_2O-Al_2O_3-2.0SiO_2-504H_2O$ was transferred to teflon-lined Morey-type reaction vessels. The vessels were sealed, weighed, and placed in the centrifuge oven. The solution was allowed to react and crystalize for 5 and 7 days at a temperature of 90° C. and a force of 1 or 30 G. Each sample was cooled, filtered, and dried overnight at 100° C. As evident in Table 6, crystals of larger size were obtained at 30 G.

TABLE 6

Zeolite A Crystal Size (microns) as a Function of Time and Force

| TIME | FORCE | |
|---|---|---|
| days | 1 G | 30 G |
| 5 | 16.0 | 29.0 |
| 7 | 20.9 | 24.3 |

We claim:

1. A process for preparing enhanced crystals comprising: growing said crystals from a gel in a force greater than the earth's gravitational force.

2. The process claimed in claim 1 wherein the crystal growth takes place after a chemical reaction.

3. The process of claim 2 wherein said chemical reaction takes place in a reaction mixture comprising a base and an oxide source.

4. The process of claim 2 wherein said chemical reaction takes place in a reaction mixture comprising a base and a source oxide of one or more elements selected from the group consisting of silicon, aluminum, gallium, germanium, beryllium, boron, iron, chromium, phosphorous, and magnesium.

5. The process of claim 2 wherein said chemical reaction mixture takes place in a reaction mixture comprising a base, a phosphorous oxide source and an aluminum oxide source.

6. The process claimed in claim 2 wherein said chemical reaction takes place in a reaction mixture comprising a silica source and a base.

7. The process claimed in claim 6 wherein said crystal growth is initiated by a template.

8. The process claimed claim 7 wherein said template is an organic template.

9. The process claimed in claim 6 with said reaction mixture further comprising an alumina source.

10. The process claimed in claim 8 wherein the composition of said reaction mixture is $vNa_2O\text{-}w(\text{organic})\text{template-}xAl_2O_3\text{-}ySiO_2\text{-}zH_2O$, where
"v" is about 0.01 to about 20.0,
"w" is about 0 to about 20.0,
"x" is about 0 or 1,
"y" is about 2.0 to 100,000, and
"z" is about 10 to about 100,000.

11. The process as claimed in claim 6 wherein said silica source is selected from the group consisting of colloidal silica, silica gel, silicic acid, sodium silicate, and silica hydrosol.

12. The process as claimed in claim 8 wherein said organic template is a tetralkyl ammonium halide.

13. The process as claimed in claim 12 wherein said tetralkyl ammonium halide is tetrapropyl ammonium bromide.

14. The process as claimed in claim 6 wherein said chemical reaction is carried out at a temperature of about 20° C. to about 400° C.

15. The process as claimed in claim 11 wherein said silica source is colloidal silica.

16. The process as claimed in claim 4 wherein said base is a 50 wt. % sodium hydroxide solution.

17. The process as claimed in claim 10 wherein the composition of said reaction mixture is
$vNa_2O\text{-}wTPABr\text{-}100SiO_2\text{-}zH_2O$, where
"v" is about 0.1 to about 10.0,
"w" is about 0.1 to about 20.0,
"z" is about 100 to about 5,000, and
TPABr is tetrapropylammonium bromide.

18. The process as claimed in claim 17 wherein the chemical reaction and crystallization are carried out at temperatures of about 100° C. to about 200° C.

19. The process as claimed in claim 18 wherein said force is greater than about 20° G.

20. The process as claimed in claim 17 with the composition of said mixture comprising $2.55Na_2O\text{-}5.0TBABr\text{-}100SiO_2\text{-}2800H_2O$.

21. The process as claimed in claim 20 wherein the chemical reaction and crystallization are carried out at temperatures of 175° C. to 185° C.

22. The process as claimed in claim 21 wherein said force is about 50 G.

23. The process as claimed in claim 22 wherein said reaction and crystallization time is about 12 to about 60 hours.

24. The process as claimed in claim 22 wherein said reaction and crystallization time is about 84 to about 168 hrs.

25. The process as claimed in claim 10 with said reaction mixture comprising $2.78Na_2O\text{-}Al_2O_3\text{-}2.0SiO_2\text{-}504H_2O$.

26. The process as claimed in claim 25 wherein the chemical reaction and crystallization temperatures are about 90° C.

27. The process as claimed in claim 26 wherein the chemical reaction and crystallization time is about 4 days.

28. The process as claimed in claim 27 wherein said force is greater than about 10 G.

* * * * *

UNITED STATES PATENT AND TRADEMARK OFFICE
CERTIFICATE OF CORRECTION

PATENT NO.   : 5,093,095
DATED        : March 3, 1992
INVENTOR(S)  : Hayhurst et al.

It is certified that error appears in the above-identified patent and that said Letters Patent is hereby corrected as shown below:

```
Column 3, line 6, delete "y" and insert therefor --v--.
         line 16, after "vNa₂O-" delete "x" and
                  insert --w--.

Column 8, line 56, after "reaction" (1st occur.) delete "mixture".

Column 9, lines 2-3, after "is" delete "VNa₂O-w(organic)
                     template" and insert therefor
                     --vNa₂O-w(organic template)--.
```

Signed and Sealed this

Thirtieth Day of November, 1993

Attest:

BRUCE LEHMAN

Attesting Officer

Commissioner of Patents and Trademarks